(12) United States Patent
Jones, III et al.

(10) Patent No.: US 6,278,301 B1
(45) Date of Patent: Aug. 21, 2001

(54) CIRCUIT AND METHOD FOR MODULATING THE BASE FREQUENCY OF A WAVEFORM GENERATOR

(75) Inventors: Roy Clifton Jones, III, Dallas; Wayne T. Chen; Dave Cotton, both of Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/197,095

(22) Filed: Nov. 19, 1998

Related U.S. Application Data

(60) Provisional application No. 60/066,113, filed on Nov. 19, 1997.

(51) Int. Cl.[7] ................................................. H03K 3/023
(52) U.S. Cl. ........................... 327/132; 327/131; 327/137
(58) Field of Search .................................... 327/172, 131, 327/134, 137, 111

(56) References Cited

U.S. PATENT DOCUMENTS 4,384,305 * 5/1983 Sonnenberger ...................... 327/132
5,629,644 * 5/1997 Chevallier ............................ 327/132

* cited by examiner

*Primary Examiner*—Dinh T. Le
(74) *Attorney, Agent, or Firm*—W. Daniel Swayze, Jr.; Wade James Brady, III; Frederick J. Telecky, Jr.

(57) ABSTRACT

An improved waveform generator (10) permits digital spectrum spreading by employing circuitry for controlling the charging and discharging of a load capacitor (24) to alter the generator's base frequency. A charge/discharge circuit (22) modulates the currents into the capacitor (24) to effect the slope of the triangle signal waveform (202). A threshold detector (26) determines the amplitude of the base frequency. Switch logic (28) controls an array of 1/N current switches (18) that provide incremental values of a reference source (12) to a summing function (16) which, in turn, feeds a charge/discharge circuit (22). The energy of the triangle waveform (202) remains approximately the same only it is now spread over a range of frequencies with the amplitude of the signal at a given point less than the amplitude of the base.

13 Claims, 3 Drawing Sheets

CIRCUIT AND METHOD FOR MODULATING THE BASE FREQUENCY OF A WAVEFORM GENERATOR

This application claims priority under 35 USC §119(e)(1) of provisional application number 60/066,113 filed Nov. 19, 1997.

FIELD OF THE INVENTION

The present invention relates in general to an improved waveform generator and more particularly to a pulse width modulation conversion circuit with an output capacitor having a digitally controlled charge/discharge rate that permits shifting of the generator's base frequency for limiting the amplitude of higher order harmonics near commercial RF bands.

BACKGROUND OF THE INVENTION

Without limiting the scope of the invention, its background is described in connection with techniques and methods used to reduce signals within the Radio Frequency ("RF") range. It should be understood, however, that the principles disclosed may have application in a wide array of signal transfer systems including audio and microwave applications using bands regulated and defined by the Federal Communications Commission ("FCC").

Today a wide array of products and methods exist for transmitting and receiving broadcast audio and video signals. For example, in a typical Frequency Modulation ("FM") application, a signal generator is used to create a carrier containing the video or audio content. The carrier, in turn, is transmitted inside an envelope corresponding to the FM station's modulation frequency as prescribed by the FCC which is picked up by a receiver tuned to the modulation frequency. Similar principles are employed in other commercial RF bands such as VHF, UHF and AM.

Modern electronic design applications will often combine both digital and analog signals on a single system platform. An example is an acoustic soundboard wherein the pure acoustic waveform receives digital enhancement prior to being transferred to a rendering system such as a speaker or audio recorder. Precise engineering is required to ensure that the higher order harmonics of the fundamental base frequency are small enough to limit interference with frequencies within reserved bands such as commercial FM or AM radio.

A primary goal in digital audio processing is to make efficient use of the available signal-to-noise ratio and bandwidth over a given transmission channel. For this reason, various modulation techniques have been developed to make RF waveforms travel over long distances. Modulation refers to a way of distorting a pure waveform prior to transmission along a communications channel. The communications channel may be physical (such as copper wiring or fiber optic cabling) or air (such as radio, television or satellite).

SUMMARY OF THE INVENTION

Various noise filtering and suppression techniques are commonly employed by those skilled in the art to limit interference within a given band of frequencies. Typically, a filter or combination of filters, e.g. high-pass, low-pass or band-pass, are used to suppress or dampen unwanted harmonics outside the pass range of frequencies. Based on the application, the filters can be implemented in discrete components or as an Integrated Circuit ("IC").

Spectrum spreading is a technique which can be used to disguise a signal by shifting the base frequency of the carrier signal over a range of values. A primary objective is to dampen the amplitude of the higher order harmonics while maintaining the integrity and strength of the base frequency. The energy under the carrier envelope of the spread is equal to the energy passed in the unmodulated waveform.

Tradeoffs in performance, cost and space are the critical factors that dictate a specific implementation. A discrete component solution may provide the sharpest roll-off at the cut-off frequency but may not be practical in high volume applications or where board space is limited. On the other hand, second and third order filters are available but their cost may increase significantly the total system price. What is needed is a cost effective modulation scheme that can be used to dampen energy associated with higher order harmonics.

Accordingly, the present invention is a pulse width modulation conversion circuit having an improved waveform generator with digitally controlled spectrum spreading. A ramp generator has a circuit for controlling the charge and discharge times of a capacitor that effects the generator's base frequency. The charge and discharge currents are modulated in a way that effects the slope of the waveform with a fixed threshold determining the base frequency. By modifying the magnitude of the charge and discharge current at the either peaks or valleys of the triangle, the slope of the waveform is likewise altered resulting in a base frequency shift. The carrier energy remains the same but spread over a range of frequencies inside an energy envelope with RMS values less than that of the base. A set of pass transistors add or subtract currents in proportion to a reference source of current which sets the amount of shift about the base frequency.

In one embodiment, the reference current source is fed into a current divider, which delivers a portion of the reference into a summing block. The sum of the reference and portion currents are fed into a charge/discharge circuit which drives an output capacitor in relation to an input voltage reference at the charge/discharge circuit.

A threshold detector circuit provides a feedback loop from the charge/discharge circuit and is used to control the charge and discharge of the capacitor. The loop controls whether the capacitor is charging or discharging as well as the magnitude of charge/discharge current. The threshold detector is gated to provide a change from charge to discharge of the capacitor.

Switch logic can be coupled to the current divider to set the current ratio. The switch logic, in turn, can be coupled to a control block that provides digital control of the modulator either through hard wired means, programmable memory means or other similar means of program flow control. The energy of the higher order harmonics is spread across a range of frequencies thus dampening their amplitude.

Other aspects of the invention including specific implementations are understood by those skilled in the art by reference to the following detailed description taken in conjunction with the appended drawings.

BRIEF DESCRIPTION OF THE DRAWINGS

In the figures.

Corresponding numerals in the figures refer to corresponding parts unless otherwise indicated.

DETAILED DESCRIPTION OF THE PREFERRED EMBODIMENTS

The detailed description is presented in conjunction with a triangle waveform generator used to digitally control the frequency variation with switching currents within a class D audio amplifier.

Figure 1:
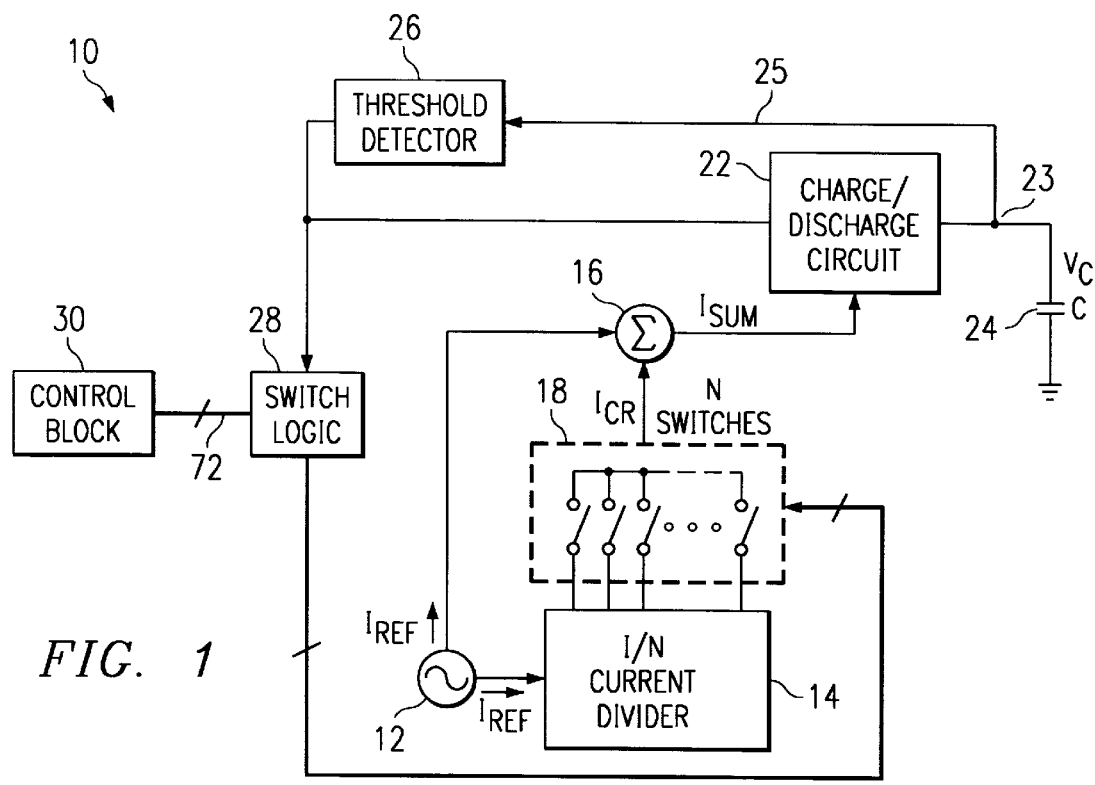
FIG. 1 is a high-level block diagram of a ramp signal generator according to one embodiment of the invention.

In reference to FIG. 1, a block diagram of a ramp signal generator is shown and denoted generally as 10. Ramp generator 10 uses a reference current source 12 (Iref) which feeds both current divider 14 and summation block 16. As shown, current divider 14 consists of N switches 18 which provide a current increment 20 (Icr) as a fraction of Iref. Thus, the inputs into summation block 16 are the current increment Icr 20 and current source Iref 12.

From the summation block 16, the summed output (Isum) feeds charge/discharge circuit block 22 which controls the voltage Vc across capacitor 24. Specifically, charge/discharge circuit block 22 controls the direction of the current into capacitor 24. The charge/discharge circuit 22 is controlled by the threshold detector 26 such that capacitor 24 is either charging current with Isum or discharging with current Isum. A feedback loop 25 is established through threshold detector 26, which also feeds switch logic block 28. As shown, the feedback loop 25 permits the switch logic block 28 to control the charge/discharge current of capacitor 24 via the 1/N current divider 14. The switch logic block 28 can be configured to alternate the charging and discharging of capacitor 24 either at the peak or valley of the signal waveform at terminal 23.

The switch logic 28 is coupled to the switches 18 via a data bus for setting the current ratio Icr as a fractioned ratio of Iref. The signal path between the control block 30 and the switch logic block 28 may be an 8-bit, 16-bit or other width data/address bus. The control block 30 provides digital control of the ramp generator 10 through hard wired means, programmable logic means or by processor control according to various embodiments.

In operation, the reference current Iref 12 establishes a base frequency for the generator 10 which is shifted about a range as different ratios of the current divider 14 are selected by the switch logic block 28. In one embodiment, the frequency at terminal 23 is the smallest when all switches 18 are OFF and Icr=0. The charge/discharge current of capacitor 24 is increased when switches 18 are closed increasing Icr thus increasing the frequency at terminal 23. For values of Icr above a minimum threshold, Isum will increase the charge and discharge current of the capacitor 24 increasing the slope of Vc as a function of time over a range of frequencies near the base frequency. Thus, by modifying the rate at which capacitor 24 is charged and discharged, the slope of the voltage waveform at terminal 23 is likewise altered resulting in a shift about the generator's base frequency. The rate can be changed sequentially (249 KHz, 250 KHz, 251 KHz, etc . . . ), randomly (250 KHz, 249 KHz, 243 KHz, 251 KHz, etc . . . ) or programmable.

Figure 2:
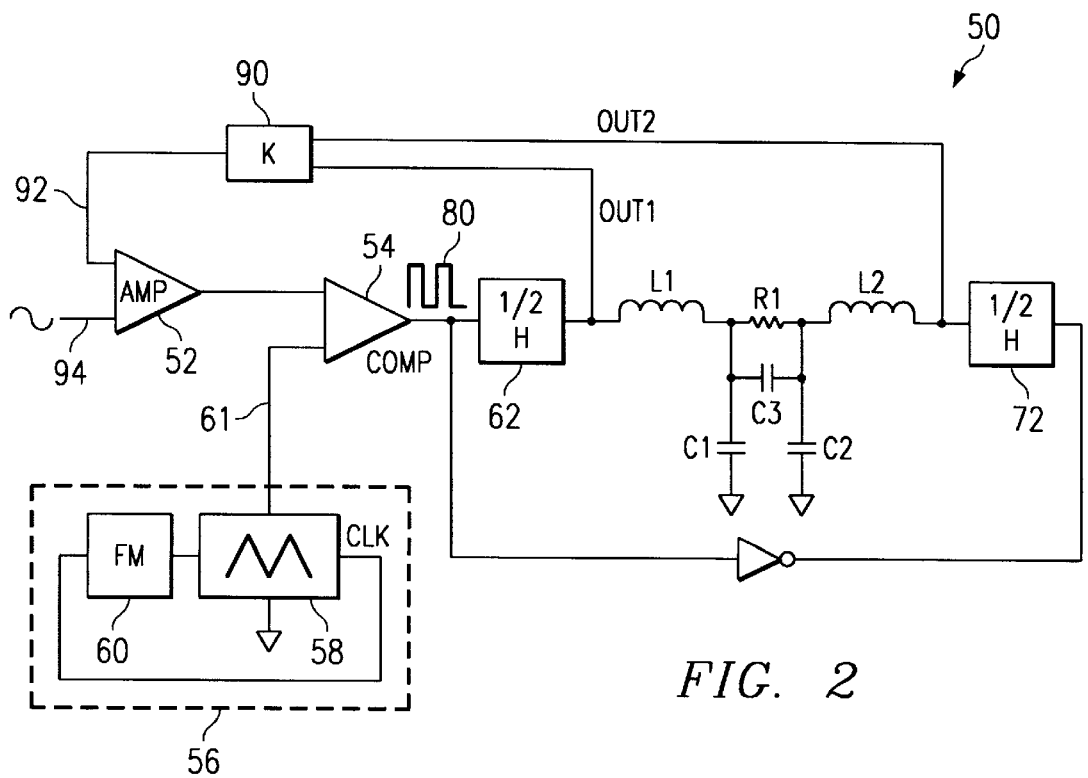
FIG. 2 is a circuit diagram of a PWM signal generator according to the invention.

Turning now to FIG. 2, a Pulse Width Modulation ("PWM") signal generator suitable for use with class D amplifiers incorporates spectrum spreading and is denoted generally as 50. PWM signal generator 50 has an input amplifier 52, which forms an input into a comparator circuit 54. The other input 61 to the comparator 54 comes from ramp waveform generator 56 which, as shown, comprises a triangle waveform generator 58 controlled by an FM modulator 60. The comparator 54 drives an output amplifier consisting of two ½ H-bridges 62 and 72.

The implementation generates a PWM signal 80 by comparing 54 the summed input 94 and feedback signals 90 to a triangle wave form generated at 58. The resulting pulse width of the PWM signal 80 is a function of the voltage level from the amplifier 52 and the triangle waveform 61. In one embodiment, the PWM generator 50 is implemented in an integrated circuit with a center frequency of 250 KHz permitting reasonable values of L1, L2, C1, C2 and C3 which make up the low pass filters at the output stage of the generator 50. A 250 KHz center frequency allows the switching speed of the H-bridges 62, 72 to be at a feasible level. However, this also causes any harmonics at the outputs of the low pass filters to be in or near commercial AM and other RF bands.

Class D or digital audio amplifiers often employ a carrier signal of a frequency much higher than the audio (typically 10 Hz to 20 KHz) frequency range. The need for the high frequency is to adequately sample the audio signal and generate a pulse width modulated digital signal without loosing much information contained in the audio signal. This high frequency signal is often referred to as the carrier signal. In FIG. 2 the carrier is shown to be a triangle waveform 58. This could also be a sawtooth waveform. The triangle or sawtooth waveform is used in conjunction with the comparator 54 to sample the audio signal and produce a pulse width modulated (PWM) representation of the audio signal. The base frequency of the PWM signal is equal to the frequency of the waveform 58. The power of the PWM signal is then increased through the ½ H-bridges 62 and 72. The amplified signal Out1 and Out2 is then passed through low pass filters constructed with frequency response characteristics such that the audio signal will be reconstructed/recovered across the load R1 typically a loudspeaker.

A concern with this type of audio amplifier is the residue and harmonics of the carrier signal that fall within the range of commercial RF bands. Of particular concern are those components that fall within the commercial AM bands. The $2^{nd}$ order low pass filters L1, C1 and L2, C2 could be replaced with filters of higher order or lower 3 db frequency in order to further attenuate the RF frequency components. However, the first solution results in increased system cost while the second results in reduced audio performance.

Figure 3:
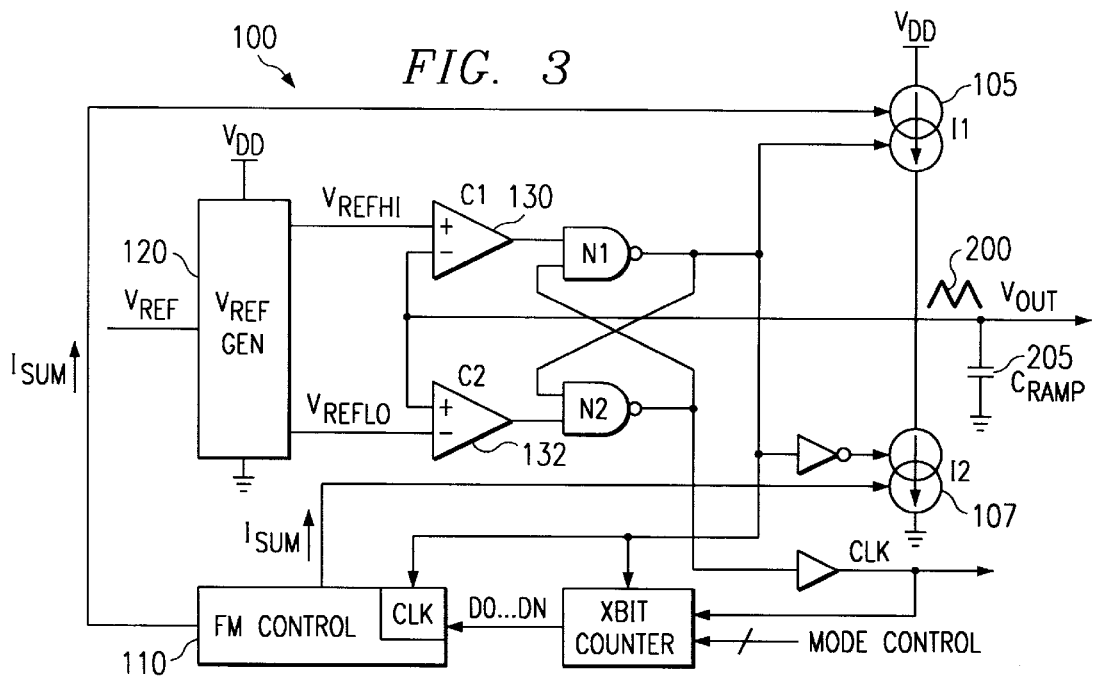
FIG. 3 is a circuit diagram of triangle waveform generator according to one embodiment of the invention.

Prior art methods of reducing the interference created by these harmonics include the use of FM modulators at the carrier to reduce RFI created by class D amplifiers. The present invention permits the base frequency of the triangle waveform to be shifted in order to reduce the amplitude of these harmonics at or near commercial RF frequencies. In this regard, FIG. 3 is detailed circuit diagram of an improved triangle waveform generator, denoted generally as 100, according to the preferred embodiment of the invention.

As shown, a triangle waveform 200 is created by the charging and discharging action of capacitor Cramp 205 which is controlled by switching current sources 105 and 107 (I1 and I2). Preferably, current sources 105 and 107 are designed so that currents I1 and I2: 1) are a function of the differential voltage from the voltage generator 120 compared with Vout (Vrefhi−Vreflo=ΔV); 2) can be trimmed to allow for process tolerance; and 3) can be modified by the FM control block 110.

In the preferred embodiment, the incremental changes in I1 and I2 are identical, as far as device matching will allow, and are gated so that the change in current occurs only at the peak of the triangle waveform 200. Alternatively, signals could be inverted so that current changes occur at the valleys of each triangle 200.

The Vref generator 120 produces two voltages that are ratioed to Vdd:

$$Vrefhi=Vref+(Vdd/K)*N$$

$$Vreflo=Vref+(Vdd/K)*N$$

Where N=ratio of two poly-resistors. Additionally, I1 and I2 are ratioed to Vref and a resistor RI so that $I1=I2=(Vdd/K)*(1/R1)$.

Comparators C1 and C2 drive the latch comprised of logic gates N1+N2 to control which of the current sources 105 or 107 is ON at any given time. If Vout exceeds Vrefhi, logic gate N1 will flip causing I1 (i.e. current source 105) to turn OFF while I2 turns ON. Cramp 205 will discharge at a constant rate until the output voltage drops to Vreflo. Likewise, when the Vout reaches Vreflo logic gate N2 will flip again causing I2 to turn OFF and I1 to turn on again. Cramp 205 will then change at a constant rate until the output voltage Vout reaches Vrefhi to repeat the sequence.

The ramp generator frequency (Fgen) can be derived as follows:

$$i=C*(dv/dt) \text{ where } dv=\Delta V \text{ and } i=I1=I2$$

Since $$F=1/(2dt)=i/(2*Cramp*\Delta V)$$

and $$\Delta V=Vrefhi-Vreflo=(vd/K)*N*2$$

Since $$i=Vdd/K*1/R$$

$$Fgen=1/(4*R*N*Cramp).$$

Currents within the switching current sources 105 and 107 are realized by adding the incremental currents to the reference current which equals $(Vdd/K)*(1/R)$. The resulting increment sets the frequency shift. Since the shift occurs at the peak or valley of the ramp output Vout, I1 and I2 can be changed by one of several current increments that are fractioned to the base current of $(Vdd/K)*(1/R)$. This insures that distortion due to frequency shift will be minimized and that both the number of different frequencies and the rate of change are under digital control as represented by the FM Control Block 110. Digital control can be accomplished either through any of various nonvolatile logic means including hard wired logic, EE PROM programming, or processor control according to various embodiments.

Figure 4:
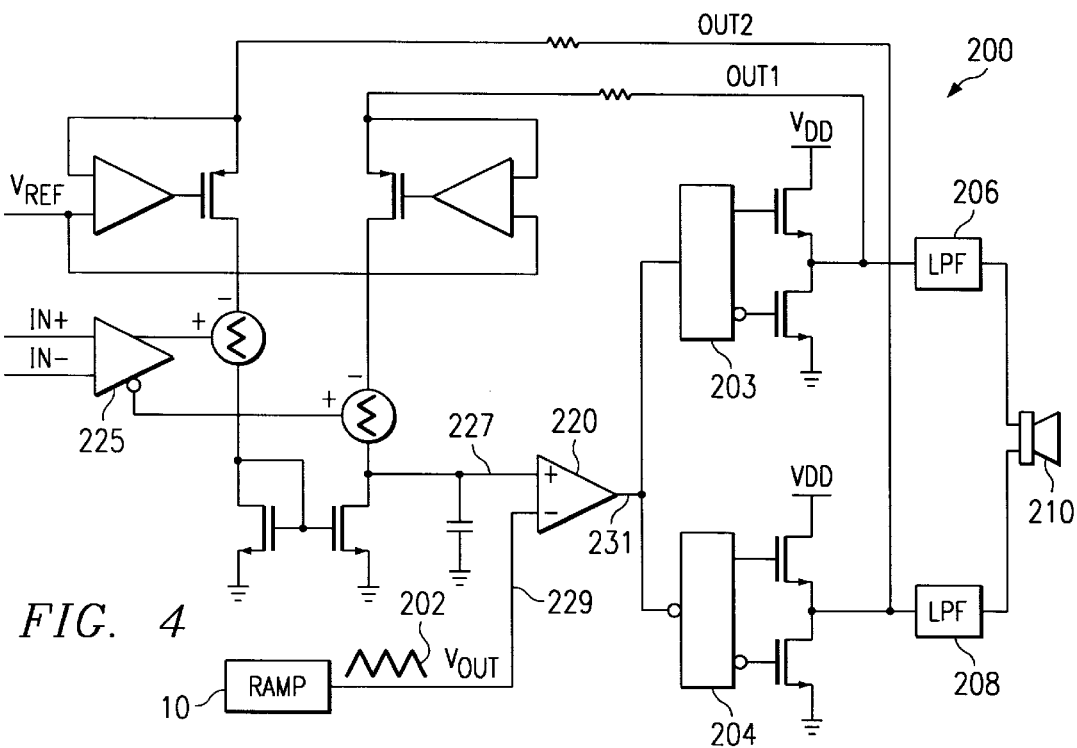
FIG. 4 is a circuit diagram of an audio amplifier using a triangle waveform generator of the present invention.
Figure 5:
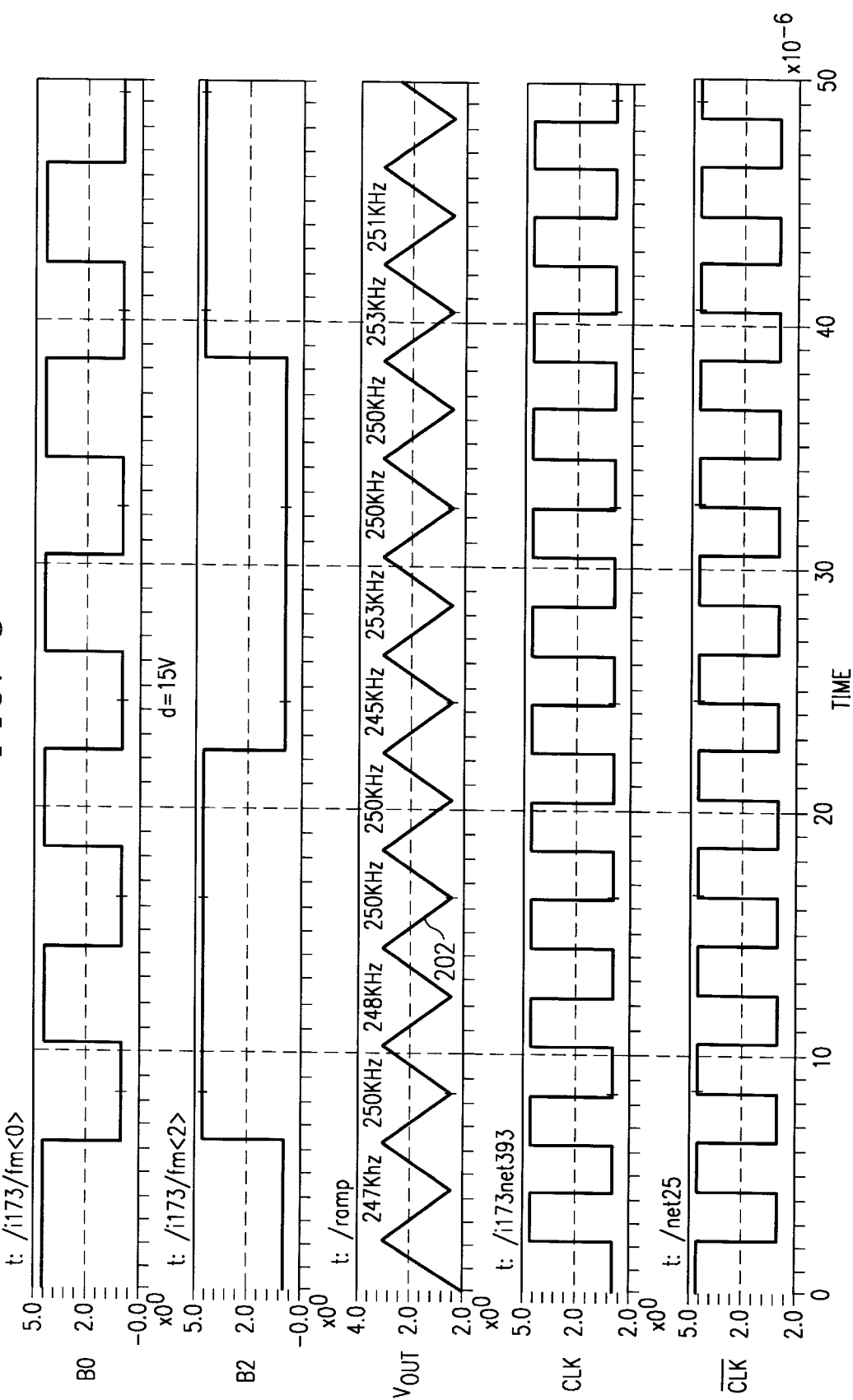
FIG. 5 show a timing diagram of the triangle waveform generator output.

Use of the improved triangle waveform generator of the present invention in a Class D amplifier 200 is illustrated in FIG. 4. The ramp signal generator 10 produces a ramp signal 202 which may be a triangle or sawtooth waveform according to various embodiments. The output 202 is fed into a comparator circuit 220 which, in turn, drives the power amplifiers 203 and 204. The amplified signals Out1 and Out2 are then passed through low pass filters 206 and 208 and constructed with frequency response characteristics such that the audio signal will be reconstructed/recovered across the speaker 210.

An analog signal source 225 generates an analog waveform that is input into the comparator circuit 220 at input terminal 227. The other input 229 into the comparator circuit is the ramp signal 202. The ramp signal 202 is characterized as having a peak signal amplitude at some high voltage reference and a valley amplitude at a low voltage reference. The analog waveform output from the signal source 225 swings within the high voltage reference and the low voltage reference.

The comparator circuit 220 takes inputs 227 and 229 and outputs at terminal 231 a signal proportional to said analog waveform generated by source 225 and the amplitude of said ramp signal 202. A simulation timing diagram of the triangle waveform 202 (Vout) produced by the ramp generator 10 is shown illustrating the frequency shift of the signal 202 as a function of the FM control bits B0 and B2. More specifically, a random shift of the signal 202 is depicted (247 KHz, 248 KHz, 250 KHz, 253 KHz etc . . . ) as measured from the peaks of successive signal cycles. In like manner, the ramp generator 10 can produce a signal 202 that is shifted sequentially or according to a predetermined program implemented in the control block 30.

"Processor", "processing means" or "microprocessor" in some contexts is used to mean that a microprocessor is being used on the portable system board but may also mean that a memory block (RAM, cache, DRAM, flash memory and the like) coprocessor subsystem and the like is being used. The usage herein is that terms can also be synonymous and refer to equivalent things. The phrase "circuit" or "circuitry" comprehends ASIC (Application Specific Integrated Circuits), PAL (Programmable Array Logic), PLA (Programmable Logic Array), decoders, memories, non-software based processors, or other circuitry, or digital computers including microprocessors and microcomputers of any architecture, or combinations thereof. Words of inclusion are to be interpreted as nonexhaustive in considering the scope of the invention.

Internal and external connections, communications links circuit or signal pathways can be ohmic, capacitive, direct or indirect, via intervening circuits or otherwise. Implementation is contemplated in discrete components or fully integrated circuits in silicon, gallium arsenide, or other electronic material families, as well as in optical-based or other technology-based forms and embodiments. It should be understood that various embodiments of the invention can employ or be embodied in hardware, software or micro coded firmware. Process, timing and schematic diagrams are also representative of flow diagrams for micro coded and software based embodiments.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A waveform generator comprising:
   a reference source providing a base frequency signal;
   a signal divider having an input terminal coupled to said reference source and an output terminal coupled to a plurality of selectively engaged switches, said switches providing incremental portions of said base frequency signal;

a summing block having first and second input terminals coupled to said reference source and said switches, respectively, and an output terminal providing a summed portion of said incremental portions and said reference source;

a load capacitor; and a charge/discharge circuit having a first input terminal coupled to said summed portion, a second input terminal coupled to a feedback loop and an output terminal coupled to said load capacitor, said charge/discharge circuit configured to control a charge/discharge rate of said load capacitor as a function of said base frequency signal and said incremental portions.

2. The waveform generator of claim 1 further comprising:

a switch logic block controllably coupled to said second input terminal of said charge/discharge circuit and said switches; and said feedback loop including a threshold detector.

3. The waveform generator of claim 2 wherein said switch logic block controls the charge/discharge rate of said load capacitor on a peak level of said base frequency signal.

4. The waveform generator of claim 2 wherein said switch logic block controls the charge/discharge rate of said load capacitor on a valley level of said base frequency signal.

5. The waveform generator of claim 2 further comprising a control block controllable coupled to said switch logic block.

6. The waveform generator of claim 5 wherein said control block includes a programmable counter to modify a base frequency generated by said reference source.

7. A triangle waveform generator with a digitally controlled shifting base frequency comprising:

an analog signal source generating a reference frequency signal;

a signal divider having an input terminal coupled to said analog signal source and an output terminal coupled to a plurality of selectively engaged switches, said switches providing incremental outputs of said reference frequency signal;

a summing block having a first input terminal coupled to said analog signal source, a second terminal coupled to incremental outputs and an output terminal providing a summed portion of said incremental outputs and said reference frequency signal;

a load capacitor;

a charge/discharge circuit having a first input terminal coupled to said summing block, a second input terminal coupled to a feedback loop and an output terminal coupled to said load capacitor, said charge/discharge circuit configured to control the charging and discharge action of said load capacitor so that a voltage amplitude across said load capacitor forms a triangle waveform and peak-to-peak levels of successive triangle waveforms being a shifting function of the summed portion versus the reference frequency signal;

a switch logic block coupled to said second input terminal of said charge/discharge circuit and said switches; and said feedback loop forming a signal path from said load capacitor to said switch logic block.

8. The triangle waveform generator of claim 7 wherein said switch logic block controls the charging and discharging of said load capacitor at peak level of the triangle waveform.

9. The triangle waveform generator of claim 7 wherein said switch logic block controls the charging and discharging of said load capacitor at a valley level of said triangle waveform.

10. The triangle waveform generator of claim 7 further comprising a control block coupled to said switch logic block through a data bus.

11. The triangle waveform generator of claim 10 wherein said control block comprises a nonvolatile memory means containing a predetermined program that controls operation of said switch logic block.

12. The triangle waveform generator of claim 10 wherein said control block comprises a processor means containing a for executing steps that control operation of said switch logic block.

13. The triangle waveform generator of claim 10 wherein said control block comprises a logic that controls operation of said switch logic block.

* * * * *